United States Patent [19]

Ochi et al.

[11] Patent Number: 4,698,688
[45] Date of Patent: Oct. 6, 1987

[54] IMAGE PROCESSING SYSTEM

[75] Inventors: Hiroshi Ochi; Nobuji Tetsutani, both of Yokosuka; Tetsuji Yamamoto, Yokohama; Shigehisa Kitani, Chigasaki; Asao Watanabe, Kurume, all of Japan

[73] Assignee: Nippon Telegraph and Telephone Corporation; Canon Kabushiki Kaisha, both of Tokyo, Japan

[21] Appl. No.: 752,720

[22] Filed: Jul. 8, 1985

[30] Foreign Application Priority Data

Jul. 11, 1984 [JP] Japan ................... 59-142260

[51] Int. Cl.⁴ .................. H03M 7/04; H03M 7/30; H04N 1/32; H04N 1/40
[52] U.S. Cl. .................. 358/257; 340/347 DD; 358/280; 358/283; 364/519; 379/93; 379/100
[58] Field of Search ............... 358/283, 280, 257, 256; 179/2 D, 2 P; 340/347 DD; 364/519; 375/26, 122; 379/93, 100

[56] References Cited

U.S. PATENT DOCUMENTS

| | | | |
|---|---|---|---|
| 4,144,560 | 3/1979 | Harris | 364/519 |
| 4,367,533 | 1/1983 | Wiener | 364/519 |
| 4,384,307 | 5/1983 | Kuzmik | 179/2 DP |
| 4,467,363 | 8/1984 | Tench | 358/256 |

Primary Examiner—Howard W. Britton
Attorney, Agent, or Firm—Fitzpatrick, Cella, Harper & Scinto

[57] ABSTRACT

An image processing system includes an image reader unit which reads an image so as to generate it as 4-bit data, and a communication unit for converting the 4-bit data into 6-bit data. The communication unit forms the 6-bit data in such a manner that an upper 2-bit component of the 4-bit data is added to the 4-bit data as a lower 2-bit component of the 6-bit data. The resultant 6-bit data is supplied to a binary printer and is subjected to halftone processing and printing. Image signals having different bit numbers can be processed and excellent image reproduction can be achieved with a simple system.

5 Claims, 8 Drawing Figures

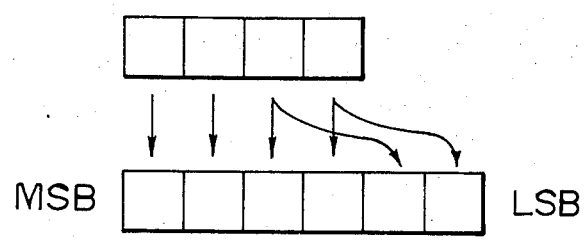
F I G. 2A
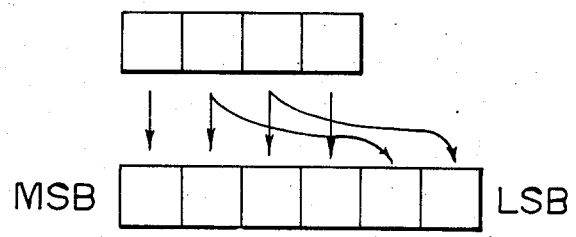
F I G. 2B
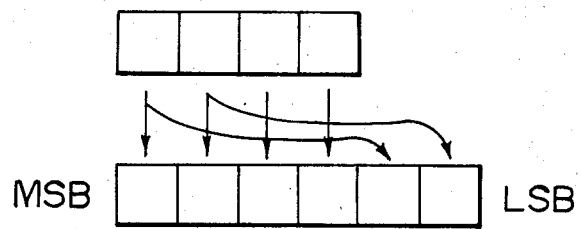
F I G. 2C

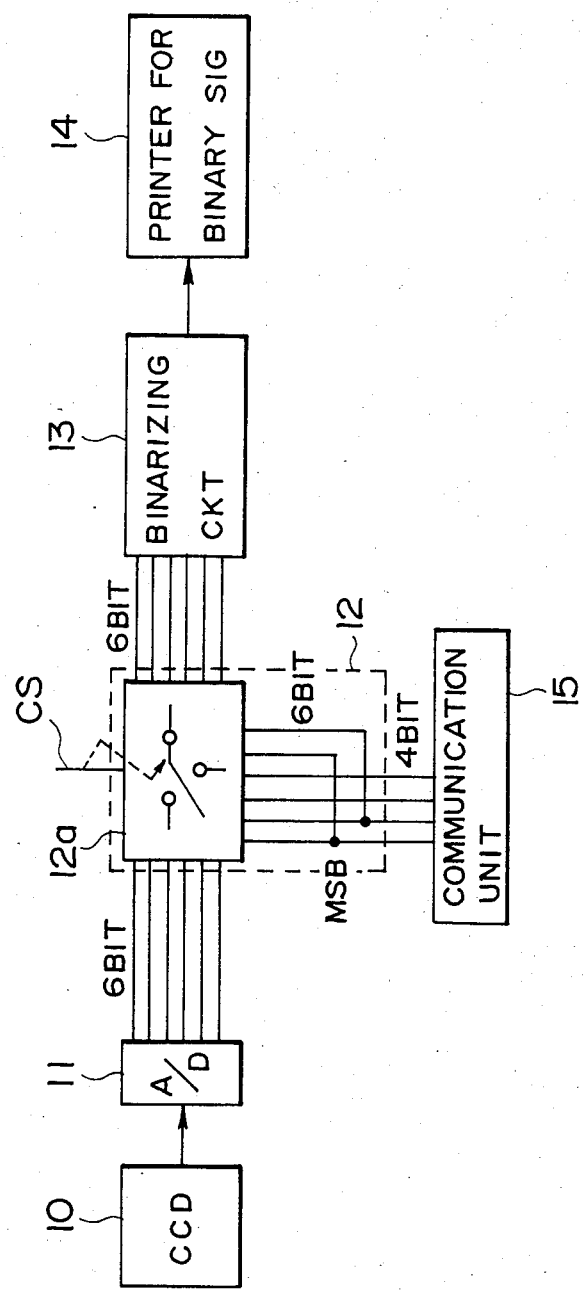
F I G. 5

IMAGE PROCESSING SYSTEM

BACKGROUND OF THE INVENTION

1. Field of the Invention

The present invention relates to an image processing system suitable for a copying machine, facsimile system and the like which digitally process image data and, more particularly, to an image processing system which can perform image processing even when an image signal having a different bit number is supplied.

2. Description of the Prior Art

Conventional image processing systems of this type include:

(1) An apparatus for reading image data as a 6-bit density signal so as to reproduce a quasihalftone image using a binary printer; and (2) An apparatus for reading image data as a 4-bit density signal so as to perform image reproduction using a multi-level printer (which can change a size of dots in accordance with density level). Thus, the number of bits of an image signal processed in the apparatuses may differ in accordance with the type of printer used or image data to be processed.

Recently, communication technology has greatly advance, and data communication between the different types of apparatuses described above is required.

In this case, when data communication is performed between such apparatuses, since the number of bits to be processed in the apparatuses may differ, any processing of image signals may be required in a given instance.

SUMMARY OF THE INVENTION

It is an object of the present invention to provide an improvement in an image processing system.

It is another object of the present invention to provide an image processing apparatus which can communicate with various types of apparatuses.

It is still another object of the present invention to provide an image processing system which can process image signals having different data formats, and can perform satisfactory image reproduction.

It is still another object of the present invention to provide a simple image processing system which can receive an image signal having a different data format and can obtain a good reproduced image.

It is still another object of the present invention to provide an image processing system which can process an image by converting an N-bit gradation signal to a pseudo M-bit (M>N) gradation signal with a simple hardware configuration.

According to the present invention, the foregoing objects are attained by providing an image processing system having a reader unit which generates 4-bit data representing a read image, and a communication unit which converts the 4-bit data into 6-bit data. The latter data is formed in such a manner that the upper two bits of the original 4-bit data are appended to the latter, thereby providing a 6-bit byte of which the two upper bits are identical to the two lower bits. The resultant 6-bit data is supplied to a binary printer, and can be subjected to appropriate half-tone processing for printing.

The above and other objects, features and advantages of the present invention will be more fully appreciated from the following detailed description of the preferred embodiment and claims in condjunction with accompanying drawings.

BRIEF DESCRIPTION OF THE DRAWINGS

FIGS. 2A to 2C show bit formats for explaining the principle of the present invention;

FIG. 5 is a circuit diagram showing an image processing system according to an embodiment of the present invention.

DETAILED DESCRIPTION OF THE PREFERRED EMBODIMENT

An embodiment of the present invention will be described in detail with reference to the accompanying drawings.

Figure 1:
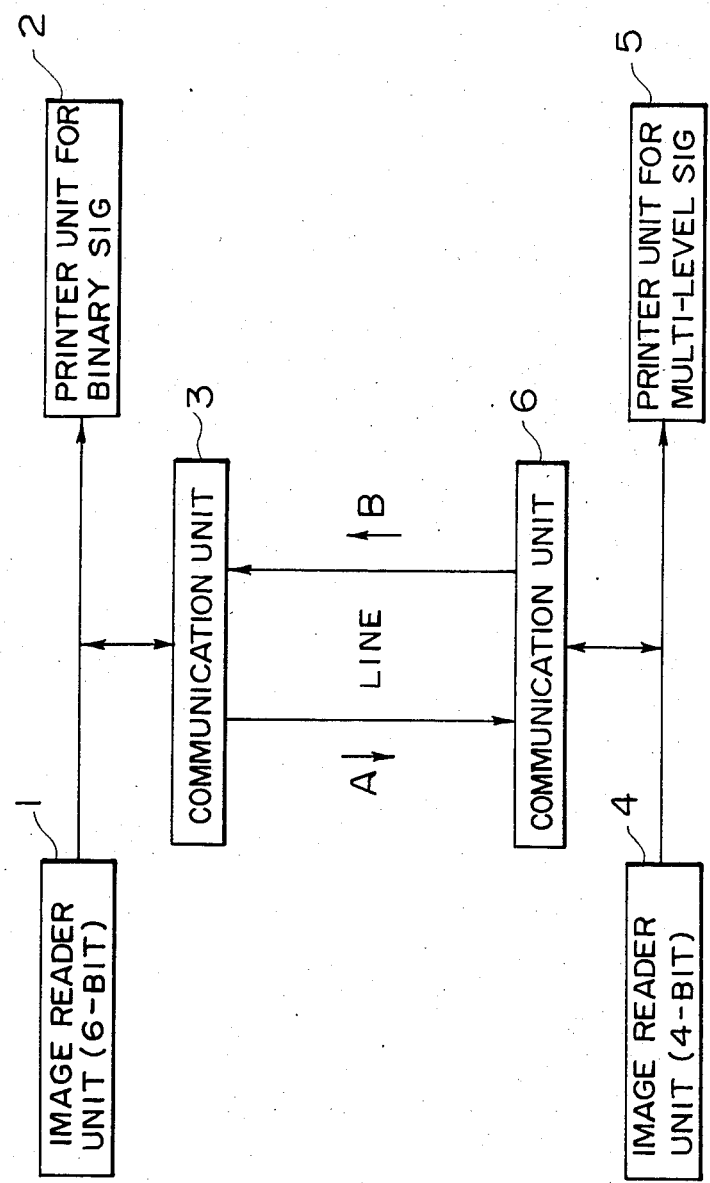
FIG. 1 is a block diagram showing an image processing system to which the present invention can be applied.

FIG. 1 shows an image processing system to which the present invention can be applied. Referring to FIG. 1, an image reader unit 1 reads 6-bit image data. A printer unit 2 for binary signals is connected to the image reader unit 1, and processes the 6-bit image data therefrom so as to reproduce an image. A communication unit 3 is connected to the units 1 and 2 communicate with an external device. An image reader unit 4 reads 4-bit image data. A printer unit 5 for a multilevel signal is connected to the image reader unit 4, and processes the 4-bit image data therefrom so as to form an image. A communication unit 6 is connected to the units 4 and 5, and communicates with an external device.

When 6-bit image data from the communication unit 3 is to be transferred through a communication line A and the communication unit 6 to the printer unit 5 which processes 4-bit image data, the upper 4 bits of the 6-bit image data are used. However, when the 4-bit image data is supplied from the communication unit 6 to the communication unit 3 through a communication line B, since the reproduction apparatus is the binary printer, either of the following methods is adopted:

(1) The image data is converted into binary data in the communication unit 6, and thereafter is transmitted; or (2) The image data is transmitted as 4-bit multi-level data. However, in the method (1), the amount of data transmitted may be large, in accordance with a type of image. In the method (2), the 4-bit data must be converted into quasi-6-bit data.

In the printer unit 2, when the 6-bit data is "3F" (hexadecimal notation), the corresponding part of the reproduced image a black, and white when it is "00" (hexadecimal notation). For this reason, when data "F" (hexadecimal notation) corresponding to black is supplied as 4-bit data, the lower 2-bits must be added to the data in order to convert it into data "3F" (hexadecimal notation). If not, black cannot be completely reproduced. The present invention adopts the method (2).

FIGS. 2A to 2C show bit formats for explaining the principle of the present invention. Referring to FIGS. 2A to 2C, a 2-bit component of a 4-bit signal is added to the 4-bit signal as a lower 2-bit component so as to form a 6-bit signal.

FIG. 2A shows a method for adding a lower 2-bit component of 4-bit data as a lower 2-bit component of 6-bit data. FIG. 2B shows a method for using the intermediate two bits. FIG. 2C shows a method for using the upper 2 bits.

Figure 3:
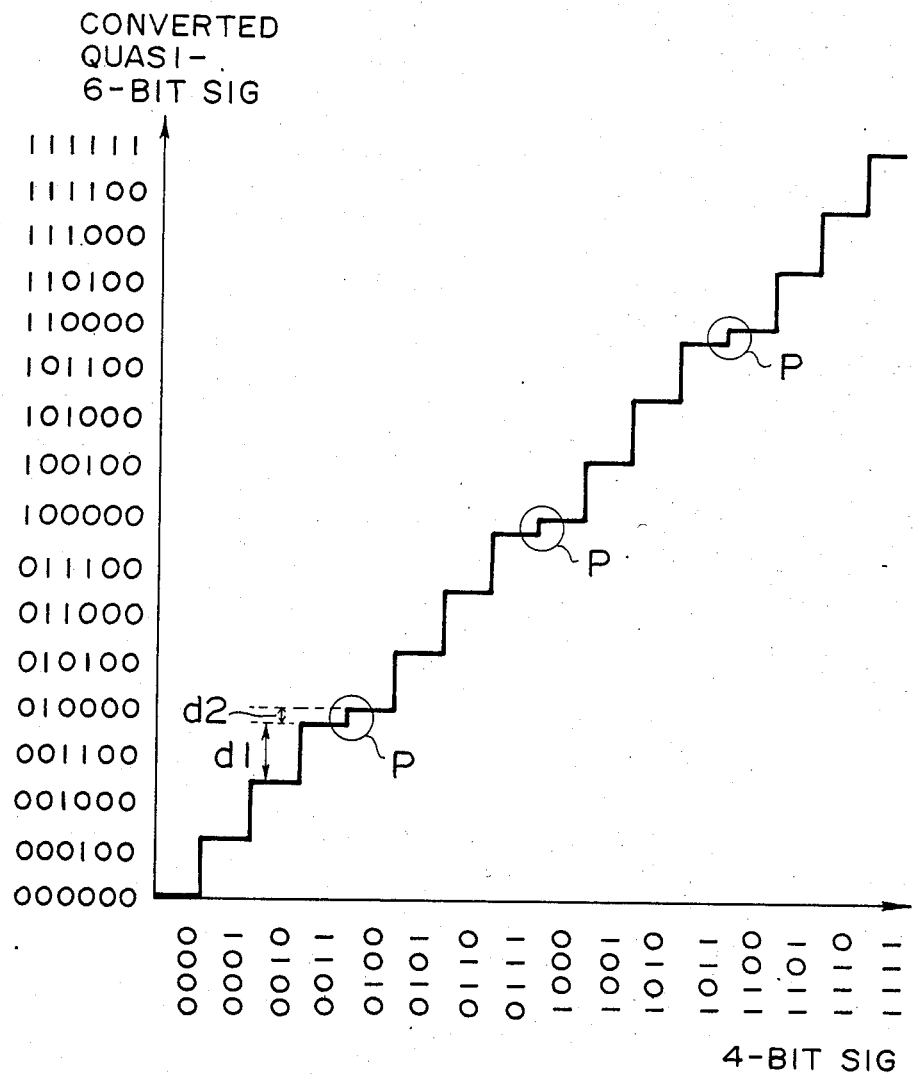
FIGS. 3 and 4 are graphs for explaining the principle of the present invention.

FIG. 3 shows conversion characteristics according to the method shown in FIG. 2A. As can be seen from the graph, in portions P surrounded by hollow circles, a change in data after 6-bit conversion is small. For example, when a 4-bit signal is increased from "0010" to "0011", a change "d1" is generated. However, when the 4-bit signal is increased from "0011" to "0100", the data is changed only by "d2". This means a gradation level is decreased when image reproduction is performed using data after 6-bit conversion. That is, of 16 gradation levels, only 13 gradation levels are reproduced.

Figure 4:
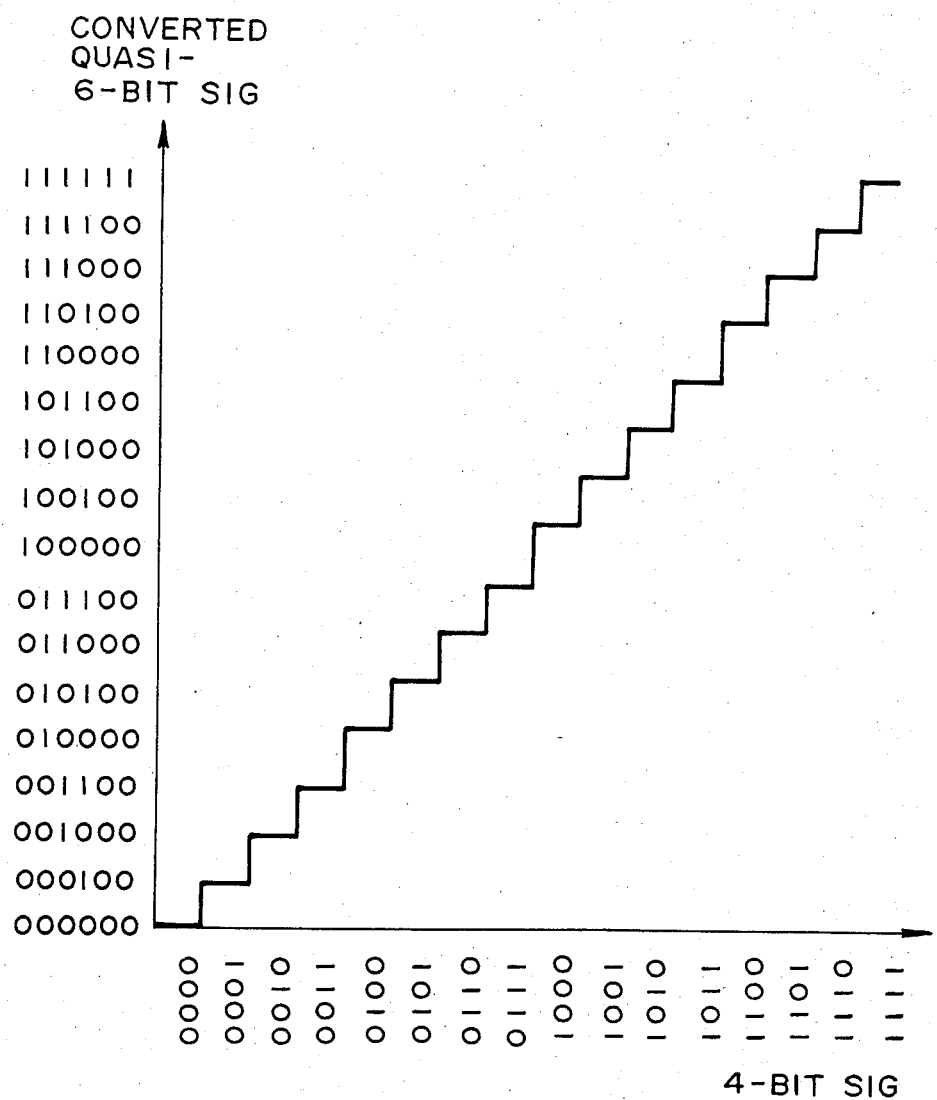

The same phenomenon occurs in the method shown in FIG. 2B. Therefore, the present invention adopts the method shown in FIG. 2C. According to the method shown in FIG. 2C, as is apparent from the conversion characteristics shown in FIG. 4, a decrease in the gradation level is reduced, and good gradation reproduction can be achieved.

FIG. 5 shows an embodiment of the present invention. A circuit shown in FIG. 5 can be used as the image reader unit 1, the printer unit 2, and the communication unit 3 in FIG. 1. An image read by an image reader unit such as a CCD is converted into a 6-bit digital signal by an A/D converter 11, and the digital signal is supplied to a multiplexer 12a. For a 4-bit signal demodulated by a communication unit 15, an upper 2-bit component thereof is added to this 4-bit as a lower 2-bit component, and the resultant signal is supplied to the multiplexer 12a. The multiplexer 12a selects one of the two signals in accordance with a switching signal CS, and supplies the selected signal to a binarizing circuit 13. Note that the binarizing circuit 13 is configured so as to process a 6-bit image signal. A binary image singal is formed, e.g., by using a dither method, and the binary signal is supplied to a printer unit 14 for a binary signal so as to be subjected to image reproduction.

Note that the switching signal CS can be supplied by an operator upon operation of a switch (not shown) on an operation unit provided at the bianry printer unit 14 side, and can alternatively be supplied from other external circuits.

In the above embodiment, a case has been described wherein 4-bit image data is converted into 6-bit image data. However, when 4-bit image data is converted into 10-bit image data, a method shown in FIG. 6 can be used.

Figure 6:
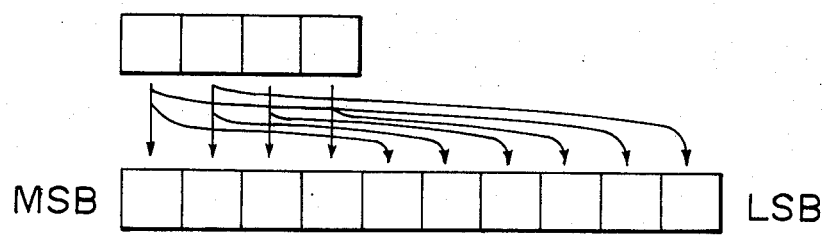
FIG. 6 is a view for explaining a method for converting 4-bit image data into 10-bit image data.

As can be seen from FIG. 6, a 4-bit signal is repeated twice from the LSB side without changing the bit order, so as to form an 8-bit signal, and the upper 2 bits of the original 4-bit signal are added to the 8-bit signal as the lower 2 bits to obtain a 10-bit signal. In this manner, the number of bits of the image data can be increased.

Note that a bit number changing circuit 12 is provided at a reception device side of an image signal in FIG. 5, but can be provided at a transmission device side of the image signal.

In other words, referring to FIG. 1, the bit number changing circuit 12 can be provided between the image reader unit 4 and the communication unit 6. When the image data is transferred from the image reader unit 4 to the binary printer unit 2, the 6-bit converted data can be transferred.

Alternatively, the bit number changing circuit 12 can be provided in a repeater unit provided between reception and transmission devices.

The present invention is not limited to the above embodiment, and various modifications may be made within the scope of claims.

What we claim is:

1. An image processing system comprising:
   means for generating N-bit image data; and
   means for converting the N-bit image data generated from said generating means into M-bit (M>N) image data, wherein
   said converting means forms the M-bit image data in such a manner that an upper (M−N) bit component of the N-bit image data is added to the N-bit image data as a lower bit component.

2. A system according to claim 1, further comprising first image reader means for reading an image so as to supply the read image as M-bit image data, and means for selecting at least one of the M-bit image data generated from said first reader means and the M-bit image data generated from said converting means.

3. A system according to claim 1, wherein said generating means comprises second image reader means for reading an image so as to supply the read image as the N-bit image data, and transferring means for transferring the N-bit image data generated from said second image reader means.

4. A system according to claim 1, further comprising binary data generating means for halftone processing the M-bit image data generated from said converting means so as to generate the M-bit image data as binary data.

5. A system according to claim 4, further comprising printing means for performing image reproduction in accordance with the binary data generated from said binary data generating means.

* * * * *